(12) United States Patent
Joshi et al.

(10) Patent No.: US 8,679,896 B2
(45) Date of Patent: Mar. 25, 2014

(54) DC/DC CONVERTER POWER MODULE PACKAGE INCORPORATING A STACKED CONTROLLER AND CONSTRUCTION METHODOLOGY

(71) Applicant: National Semiconductor Corporation, Santa Clara, CA (US)

(72) Inventors: Rajeev Joshi, Cupertino, CA (US); Jaime Bayan, San Francisco, CA (US); Ashok S. Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/855,143

(22) Filed: Apr. 2, 2013

(65) Prior Publication Data
US 2013/0214399 A1    Aug. 22, 2013

Related U.S. Application Data

(62) Division of application No. 13/170,017, filed on Jun. 27, 2011, now abandoned.

(51) Int. Cl.
*H01L 21/56* (2006.01)

(52) U.S. Cl.
USPC ............ 438/113; 257/686; 257/666; 257/777

(58) Field of Classification Search
USPC ........... 438/113; 257/686, 777, 690, 692, 666
See application file for complete search history.

(56) References Cited

U.S. PATENT DOCUMENTS

| | | |
|---|---|---|
| 3,915,729 A | 10/1975 | Eustice |
| 5,926,695 A | 7/1999 | Chu et al. |
| 5,994,768 A | 11/1999 | Fogelson |
| 6,061,251 A | 5/2000 | Hutchison et al. |
| 6,064,115 A | 5/2000 | Moscicki |
| 6,066,515 A | 5/2000 | Schoenfeld et al. |
| 6,072,228 A | 6/2000 | Hinkle et al. |
| 6,215,176 B1 | 4/2001 | Huang et al. |
| 6,372,579 B1 | 4/2002 | Tung |
| 6,448,107 B1 | 9/2002 | Hong et al. |
| 6,483,180 B1 | 11/2002 | Bayan et al. |
| 6,603,197 B1 | 8/2003 | Yoshida et al. |
| 7,598,603 B2 | 10/2009 | Otremba |
| 7,633,140 B2 | 12/2009 | Luo et al. |
| 7,768,123 B2 | 8/2010 | Liu et al. |
| 7,842,541 B1 | 11/2010 | Rusli et al. |
| 8,026,589 B1 | 9/2011 | Kim et al. |

(Continued)

FOREIGN PATENT DOCUMENTS

JP        06-177315        6/1994

OTHER PUBLICATIONS

Search Report dated Feb. 28, 2011 from International Patent Application No. PCT/US2010/045802.

(Continued)

*Primary Examiner* — Julio J Maldonado
*Assistant Examiner* — Jaehwan Oh
(74) *Attorney, Agent, or Firm* — Eugene C. Conser; Wade J. Brady, III; Frederick J. Telecky, Jr.

(57) ABSTRACT

Methods and systems are described for enabling the efficient fabrication of small form factor power converters and also the small form factor power converter devices.

7 Claims, 10 Drawing Sheets

(56) References Cited

U.S. PATENT DOCUMENTS

| | | | |
|---|---|---|---|
| 8,035,206 B2 * | 10/2011 | Cruz | 257/676 |
| 8,035,221 B2 * | 10/2011 | Cruz | 257/704 |
| 8,148,815 B2 * | 4/2012 | Girdhar et al. | 257/724 |
| 8,508,052 B2 * | 8/2013 | Bell et al. | 257/777 |
| 8,592,963 B2 * | 11/2013 | Cruz | 257/676 |
| 2002/0024857 A1 | 2/2002 | Stave | |
| 2005/0260795 A1 | 11/2005 | Park et al. | |
| 2007/0001274 A1 | 1/2007 | Henkle et al. | |
| 2007/0181990 A1 | 8/2007 | Huang et al. | |
| 2007/0215996 A1 | 9/2007 | Otremba | |
| 2007/0290311 A1 | 12/2007 | Hauenstein | |
| 2008/0272485 A1 * | 11/2008 | Myers et al. | 257/714 |
| 2010/0090668 A1 | 4/2010 | Girdhar et al. | |
| 2010/0176508 A1 | 7/2010 | Herbsommer et al. | |
| 2011/0089546 A1 | 4/2011 | Bayan | |
| 2011/0140249 A1 | 6/2011 | Lee et al. | |
| 2011/0241170 A1 | 10/2011 | Haeberlen et al. | |
| 2011/0298115 A1 | 12/2011 | Celaya et al. | |
| 2012/0119343 A1 * | 5/2012 | Bayan et al. | 257/676 |
| 2012/0133037 A1 | 5/2012 | Cruz | |
| 2012/0228696 A1 * | 9/2012 | Carpenter et al. | 257/329 |

OTHER PUBLICATIONS

Written Opinion dated Feb. 28, 2011 from International Patent Application No. PCT/US2010/045802.
Search Report dated Feb. 28, 2011 from International Patent Application No. PCT/US2010/045803.
Written Opinion dated Feb. 28, 2011 from International Patent Application No. PCT/US2010/045803.
Office Action dated Oct. 12, 2011 from U.S. Appl. No. 12/581,065.
Vishay Siliconix: "Integrated DrMOS Power Stage" www.vishay.com; Document No. 64981, S10-2488-Rev. E; Nov. 1, 2010; 15 pages.

* cited by examiner

DC/DC CONVERTER POWER MODULE PACKAGE INCORPORATING A STACKED CONTROLLER AND CONSTRUCTION METHODOLOGY

RELATED APPLICATIONS

This application is a divisional of co-pending application Ser. No. 13/170,017 filed on Jun. 27, 2011. Application Ser. No. 13/170,017 is hereby incorporated by reference herein in its entirety.

TECHNICAL FIELD

The present invention relates generally to power converter devices used in association with semiconductor systems. In particular, the invention refers to power converters used in DC-DC power level shifting devices and associated packages having reduced sizes and footprints. Also, the invention relates to methods of construction and packaging of these reduced size converter packages.

BACKGROUND OF THE INVENTION

In the field of electronic and computer devices, there is a need for converting one power level to another power level to enable the operation of various systems. The power level required for the various electronic systems is quite commonly different from a power level provided to the electronic device. Also, several different power levels may be required to power the various systems of an electronic device.

Also, the same electronic device typically includes systems requiring several different power levels. Thus, in many electronic devices, there is a need for one or more power level shifters.

Power level shifters generally include a power module (also referred to herein as a power converter) and several associated systems (inductor's, capacitors, and the like). Power level shifters can consist of Field Effect Transistors (FETs) and controller ICs. One such arrangement is shown in FIG. 1(a)

In the depicted prior art convertor 10 a low side field effect transistor (LS FET) 11 is arranged on a lead frame 12. Also, a high side field effect transistor (HS FET) 13 and an associated controller 14 arranged on the lead frame 12. A pair of conductive clips (C1, C2) conductively interconnect the HS FET with the LS FET to form a switching connection. A problem with this arrangement is that the pair of clips are required to appropriately connect the LS FET 11, the HS FET 13, and the controller 14. A fair amount of time and effort is required to position, align, and attach and otherwise connect the clips (C1, C2) with the FET's of the package 10.

Thus, the number of components and the alignment difficulties associated with them results in increased fabrication costs and higher failure rates in the packages produced. Additionally, the layout of FIG. 1(a) presents a relatively large surface area due its planar die arrangement. This large surface area is becoming increasingly problematic when faced with the decreasing size of consumer electronic devices. Accordingly, a need for devices (including power convertors) having a smaller "footprint" is desirable. The depicted prior art converter package 10 has a very large surface area. This takes up valuable real estate on various electronic substrates. So both the large footprint of prior art device and the need for two clips are disadvantages of the prior art.

Accordingly, as explained in this patent, a power converter package having a more compact structure with a reduced foot print, a simplified manufacturing structure, and improved fabrication processes is desirable. It is one of the objects of this patent to provide such a package and modes for its manufacture.

SUMMARY OF THE INVENTION

In a first aspect, an embodiment of the invention describes power converter package having a high side (HS) field effect transistor (FET) mounted on a lead frame and a low side (LS) field effect transistor (FET) mounted on the same lead frame. A conductive clip can electrically couple the two FET's. And a controller device is arranged above the conductive clip. One possible implementation is illustrated in the embodiment of FIG. 2(a). The HS FET and the LS FET are electrically connected with the HS FET and the LS FET to control the device. Further aspects can include the addition of a connector arranged to provide power to the various converter systems including the controller, HS FET, and the LS FET. Such packages can be encapsulated and singulated from larger arrays of such packages.

In another aspect, embodiments of the invention describe another power converter package. Such a package includes a low side field effect transistor (LS FET) mounted on a lead frame and a controller mounted on the same lead frame. A conductive clip is mounted on and electrically coupled with the LS FET and a high side field effect transistor (HS FET) to establish a switch connection for the package. An interposer element is arranged on the clip and between the HS FET and the clip to enable current to pass from a drain of the LS FET to a source of the HS FET. An aspect of the interposer element is to reorient the gate contact of the HS FET to face upward to form an improved wire bonding surface. Further aspects can include a power connector to provide power to the various converter systems. Such packages can be encapsulated and singulated from larger arrays of such packages.

In another aspect, embodiments of the invention describe a method for forming a power converter package. The method includes electrically coupling a high side (HS) field effect transistor (FET) and a low side (LS) field effect transistor (FET) to die attach pads of a lead frame. A first side of clip is electrically coupled to a drain of the LS FET and a source of the HS FET to form a switch connection such that a portion of the clip is also electrically coupled with a switch node of the lead frame. A controller can be non-conductively coupled with a second side of the clip. The gates of the HS FET and LS FET are electrically connected with the controller using wire bonding or other processes. An electrical connector can be added above the controller to provide power to controller and other systems of the package. The power converter package is encapsulated and singulated to form a completed power converter package.

In another aspect, embodiments of the invention describe a method for forming another embodiment of the power converter package. The method involves electrically coupling a LS FET to a die attach pad of a lead frame and non-conductively coupling a controller to the lead frame. A first side of a clip is electrically coupled with a drain of the LS FET and to a switch lead of the lead frame. An interposer element is arranged on a second side of the first clip opposite from the LS FET. The interposer element has a conductive gate tab and a conductive channel. A HS FET is coupled with the interposer element such that a source of the HS FET is coupled with the channel. The connection of the HS FET source, interposer channel, LS drain, and the switch lead for a switch connection. And the gate of the HS FET is coupled with the gate tab of the interposer. The controller is wire bonded to the HS FET gate using the interposer gate tab. The controller is wire bonded to the LS gate through a lead of the lead frame. The package is encapsulated and singulated to form converter packages.

General aspects of the invention include, but are not limited to methods, systems, apparatus, and related products for enabling the fabrication of reduced form factor power converter packages and the inventive power converter packages themselves.

BRIEF DESCRIPTION OF THE DRAWINGS

The invention and the advantages thereof may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF PREFERRED EMBODIMENTS

Reference is made to particular embodiments of the invention. Examples of which are illustrated in the accompanying drawings. While the invention will be described in conjunction with particular embodiments, it will be understood that it is not intended to limit the invention to the described embodiments. To contrary, the disclosure is intended to extend to cover alternatives, modifications, and equivalents as may be included within the spirit and scope of the invention as defined by the appended claims.

Aspects of the invention pertain to novel power converter modules or devices used in power level shifting applications and the methods of fabricating and packaging such devices. Such power converters are used in DC-DC voltage level shifting devices. For example in DC-DC step down level shifters and the like. In one example, a synchronous buck topology can be used in power converter modules used, for example, in a DC-DC power level shifter. Aims of the inventive technologies are to reduce power converter module footprint (surface area), increase power density (current per unit area), and simplify manufacturing by reducing the presently used two clip structure to one clip.

In another aspect, in a "stacked FET" implementation, the controller rests on the leadframe die attach pad (DAP). This orientation in grounds the controller thereby substantially immunizing it from noise generated by the operation of the FET's. Additionally, this arrangement facilitates the possibility of having vias in a multi layer PCB for improved heat dissipation. Accordingly, this implementation has certain advantages when applied to PCB layouts.

In the diagrammatic illustration of FIG. 1(b), an embodiment of an inventive power converter module is shown and shall now be described. The power converter device 100 includes a substrate 103 upon which some of the power converter module systems and devices are arranged. The substrate 103 can include a lead frame 103 having die attach pads and a plurality of conductive leads. The lead frame 103 can comprise one of many such lead frames arranged in a lead frame array. Of course other suitable substrates may also be used.

Figure 1A:
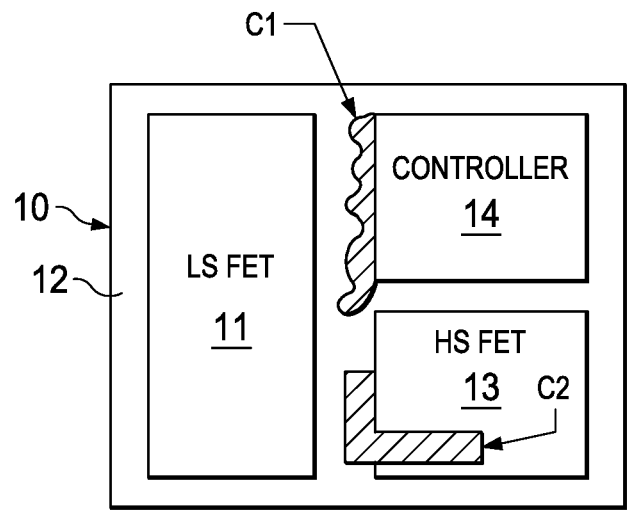
FIG. 1(a) is a plan view of a state of the art power converter device used level shifters

To continue, rather than arranging all of the systems (11, 13, 14 as shown in FIG. 1(a)) on a common level as in the prior art, the inventors employ propose a multi-level structure to form a more compact package. The following Figures and disclosure address this issue.

Figure 1B:
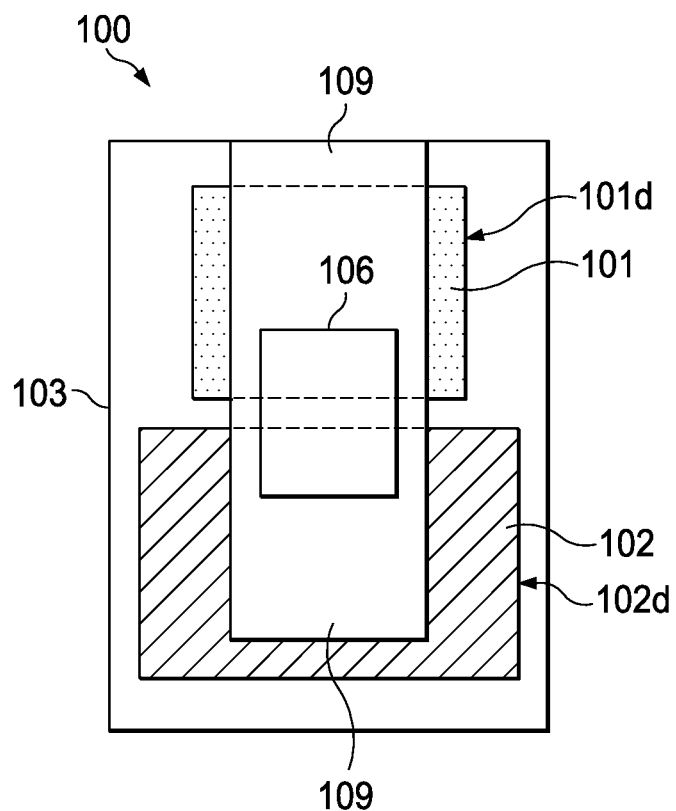
FIG. 1(b) is a simplified diagrammatic plan view of an embodiment of power converter device in accordance with the principles of the present invention.

In the simplified description of FIG. 1(b), the package 100 comprises a substrate 103 upon which other systems and components are arranged. In some embodiments, the substrate 103 comprises a lead frame which can be a pre-molded lead frame. Such a pre-molded lead frame is merely a partially fabricated lead frame. Such a pre-molded lead frame portions of the lead frame are treated with encapsulant materials lending rigidity to the pre-molded lead frame. More commonly, a standard lead frame (one having no encapsulant used) can be used. In general, the lead frame 103 includes one or more conductive die attach pads (e.g., 101d, 102d) and a plurality of conductive leads arranged peripherally about the substrate 103.

In one embodiment, a HS FET 101 and a LS FET 102 can be arranged on the die attach pads (101d, 102d) of the substrate 103. Also, a clip (not shown in this view) electrically couple the HS FET 101 with the LS FET 102. A more detailed explanation of the clip connections will be discussed below. Briefly, the clip 109 is arranged above, and connected with, both the HS FET 101 and the LS FET 102. A controller device 106 is non-conductively mounted on the clip 109. The controller 106 is operable to selectively activate/deactivate and otherwise control the operation of the two FET's (101, 102). A structure this compact substantially decreases the footprint of the package. This embodiment can reduce the footprint of this power converter package by 30-50% relative to an ordinary prior art converter module. Much of the size reduction is achieved by moving the controller 106 onto a different level of the device than the FET's.

Figure 2A:
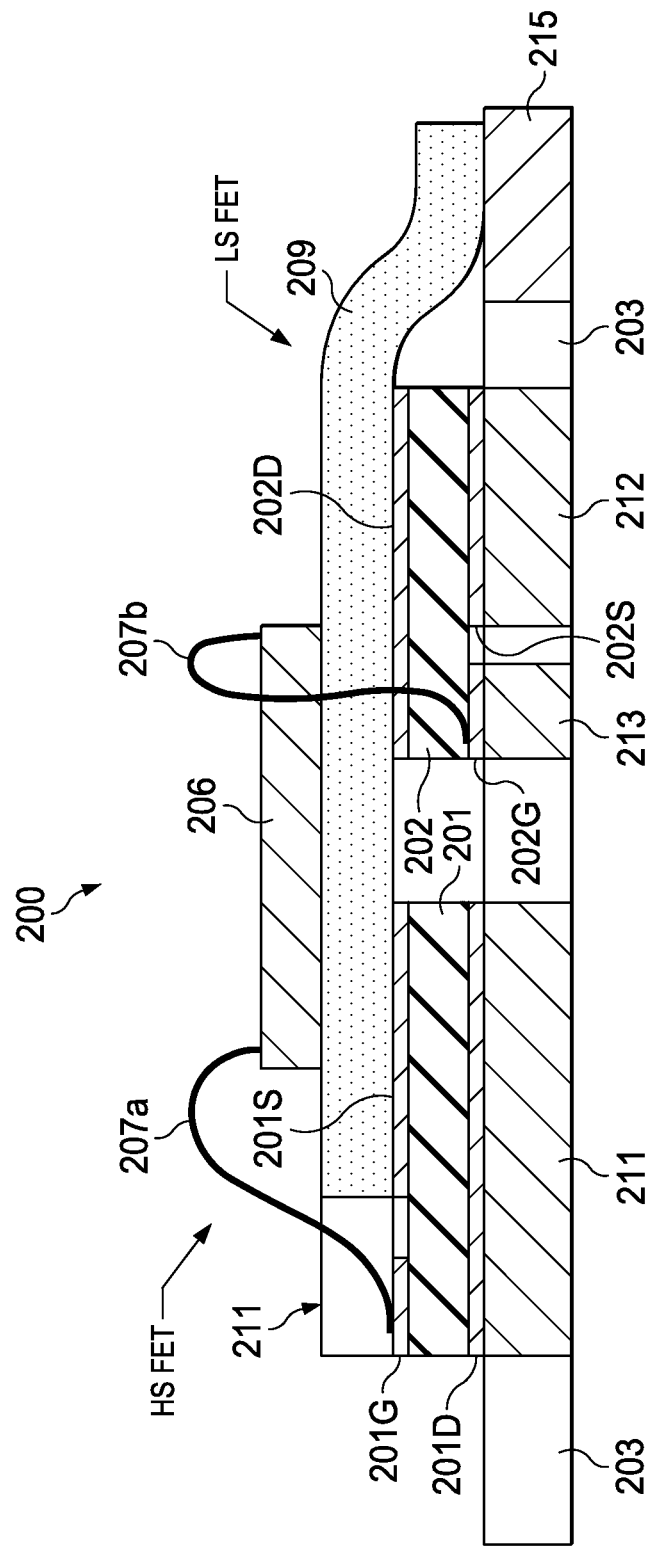
FIG. 2(a) is a simplified side section view of a portion of a power converter apparatus with a controller stacked above the FET device in accordance with the principles of embodiment of the present invention.

FIG. 2(a) illustrates a side cross section view of a portion of one particular embodiment of a converter package 200. To begin the package includes a substrate that comprises a lead frame 203 having two die attach pads (DAP's) 211, 212 arranged to mount and electrically connect with the HS FET 201 and the LS FET 202 and also a clip 209 and a controller 206.

The first pad (DAP 211) is electrically coupled with the HS FET 201. The HS FET 201 has a bottom surface having a drain contact 201D and also a facing surface having a source contact 201S and a gate contact 201S. The source 201S and gate 201G are arranged on a facing surface of the HS FET 201 and the drain 201D is arranged on a bottom surface of the HS FET 201. The HS FET is mounted "face up" such that the drain 201D is arranged on the first DAP 211.

The second DAP 212 is electrically coupled with the LS FET 202. Like HS FET 201, the LS FET 202 has a bottom surface having a drain contact 202D and also a facing surface having a source contact 202S and a gate contact 202S. The source 202S and gate 202G are arranged on a facing surface of the LS FET 202 and the drain 202D is arranged on a bottom surface of the LS FET 202. The LS FET 202 is mounted "face down" such that the source 202S is arranged on the second DAP 212. And also, the LS gate 202G is electrically coupled with the lead 213 of lead frame 203. The lead 213 can extend under the LS FET 202 to enable connection with LS gate 202G.

In one implementation, the FET's themselves can be attached using a solder paste or, alternatively ball grid array (BGA) type connections can be used. A reflow process can be used to affix and electrically connect the HS FET 201 and LS FET 202 onto the DAP's 211 and 212 respectively. It is to be pointed out that beyond the disclosed solder paste and BGA implementations, other methods known to persons of ordinary skill in the art can be used to accomplish the same task. This configuration can be extended to at least some of the other FET connections as well.

A conductive clip 209 is mounted on and electrically connected with the FET's 201,202 and contact leads of the lead frame 203. In particular, the clip 209 electrically connects the HS FET source 201S with the LS FET drain 202D and also with switch pins of the lead frame, defined here by contact 215 of the lead frame 203, to establish a switch pins for the package 200.

The lead frame 203, the two FET's 201, 202, and the clip 209 can be assembled and then affixed using a single reflow process if desired. This assembly (201, 202, 203, and 209) can be referred to as a lead frame sub-assembly.

Advantageously, a controller 206 is then mounted on an opposing side of the clip 209. Adhesives and epoxies can be used. In one implementation, the controller 206 can be mounted with the clip 209 using an epoxy, for example, in one implementation, non-conductive epoxies or other non-conductive adhesive can be used.

The controller 206 is wire bonded to the gate contact 201G of the HS FET 201, for example, using wire bond 207a. The wire bond 207a will electrically connect with the gate 202G through an opening 211 or cut out portion of the clip 209. Also, the controller 206 is wire bonded 207b with gate 202G. In most implementations this will mean wire bonding to an exposed portion of a lead 213 that is electrically coupled with the gate 202G.

These gate connections (e.g., the 207a, 207b to the gates 201G, 202G) enable the controller 206 to control the operation of the FET's 201, 202. Additionally, power can be supplied to the controller 206 using a power connection (not shown) which can, for example, be connected with leads of the lead frame assigned for that purpose.

As a general note, because the LS FET 202 is arranged face down, the lead that 213 couples with the gate 202G also should include a portion that extends beyond an outer periphery of the LS FET 202 to provide a good exposed bonding surface for the wire bond 207b.

Additional wire bonds (not shown in this view) are also formed connecting the controller 206 to various leads of the lead frame 203. This structure is then encapsulated, using an epoxy or other encapsulant material. Commonly such converter packages 200 are assembled in an array format and accordingly are singulated to form individual power converters 200.

Figure 2B:
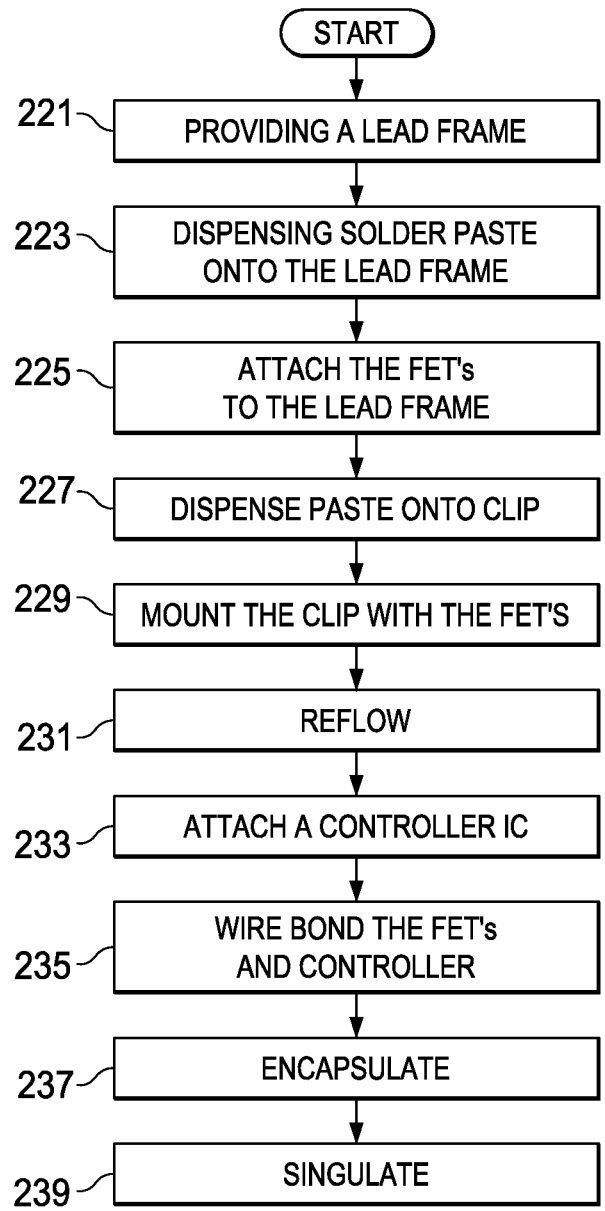
FIG. 2(b) is a simplified flow diagram illustrating a process embodiment enabling the construction of power converter devices having a controller stacked above the FET device in accordance with the principles of embodiment of the present invention.

FIG. 2(b) is a flow diagram that can be used to illustrate an example process embodiment used to form such power converters. A process can begin by providing a lead frame substrate 203 (Step 221). This can be a wafer scale array of lead frames arranged for fabrication. Additionally, a pre-molded array of lead frames can be used. Such a pre-molded lead frame is merely a lead frame treated with an encapsulant (or other material) to lend structural rigidity. It should also be pointed out that in other implementations, power convertor can be formed without using said pre-molded lead frames.

This lead frame 203 can then be treated with a solder paste to form suitable bonding sites on the leadframe 203 (Step 223). In one common implementation, the solder paste is stenciled or otherwise arranged in place on the lead frame 203. The various mounting sites of a lead frame array are treated with the paste preparing them for FET attachment. For example, solder paste layers are placed on DAP's 211 and 212 and bonding site 213 associated with the LS gate contact 202G. It is also noted that alternatively, or additionally, the FET's (201, 202) can be treated with solder paste or to place in readiness for bonding to the lead frame 203. Any of a number of solder paste processes can be used.

The FET's (201, 202) are appropriately attached to the solder paste sites indicated above (Step 225).

A clip 209 is treated with solder paste (Step 227). Accordingly, a solder paste is also attached to a clip 209 in a manner suitable for facilitating the attachment of the FET's (201, 202) with the clip 209 and also to further facilitate the mounting of the lead frame 203 (at 215) with the clip 209. Also, in some embodiments, the solder paste can be applied to the FET's (201, 202) and lead frame (at 215) instead of the clip.

The clip 209 is mounted with the FET's (201, 202) and the leadframe 203 (Step 229) to form a lead frame, clip and FET subassembly.

This subassembly is then subject to a reflow process (Step 231) to electrically connect together the FET's (201, 202), the clip 209, and the lead frame 203. In one example, a reflow process lasting for about three to four minutes having a peak temperature of in the range of about 260° to about 360° is suitable. It is however pointed out that other reflow parameters and materials can be used in accordance with the principles of the invention.

It should be pointed out that the prior operation can be performed in an order that is subject to some variation. In a preferred embodiment, the pre-reflow steps (Steps 221-229) should be performed before the reflow operation (Step 231) however several reflow operations can be used.

Subsequently, in one preferred embodiment, the controller 206 is then mounted on the clip 209 (Step 233). In one example, the controller 206 can simply be adhered to the clip 209 using an adhesive which can be can include conductive and non-conductive adhesives as well as others. Many types of epoxies work well for such implementations. Some examples include, but are not limited to Ablestik 8387 and QMI 536 HT. as well as others.

It is worth point out that the operations discussed with respect to 229-233 can be performed in a slightly different manner. The controller 206 can be mounted on one side of the clip. Then the clip is flipped over and the HS FET 201 and the LS FET 202 are coupled to a second side of the clip in a "flip chip" type attachment scheme. This assembly is then mounted with the lead frame 203.

Once mounted, the controller 206 is attached to the systems of the package using wire bonds (207, etc.) (Step 235). Such as indicated above in FIG. 2(a). Typically a number of other leads of the lead frame 203 are wire bonded with, or otherwise connected with the controller 206. Such can include power and ground contacts as well as system inputs to the controller 206.

The completed device package is then encapsulated using an appropriate encapsulant (Step 237). One example of such an encapsulant is CEL 9220. Others can also be used.

Once the encapsulant is cured, an array of formed and encapsulated converter packages can be singulated into separate device packages (Step 239).

Such an implementation carries with it the advantages of reducing the number of DAP's from three to two and reduces the number of clips from prior art two clips to the disclosed implementation having only one. This results in reduced manufacturing overhead and therefore reduced cost.

Figure 3:
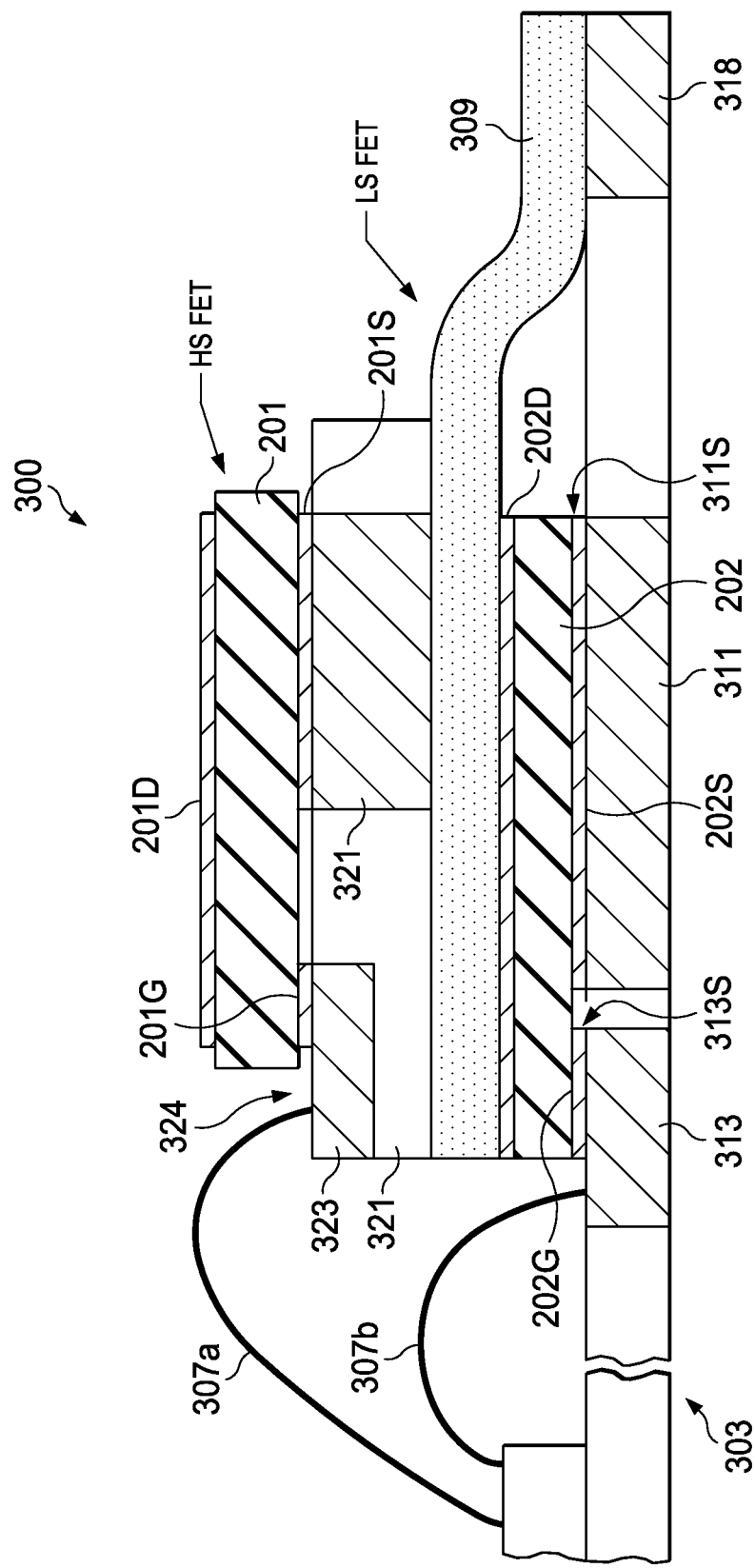
FIG. 3 is a simplified side section view of a portion of a power converter apparatus with a HS FET stacked above a LS FET and including an interposer element to reorient a gate connection in accordance with the principles of embodiment of the present invention.

The diagrammatic illustration of FIG. 3 highlights another approach using a stacked FET design that is enhanced by the presence of an interposer element. In this embodiment the power converter 300 includes a substrate 303 upon which power converter systems and devices are arranged. The substrate 303 can include die attach pads (e.g. 311) and conductive leads arranged about the periphery of the substrate. In one implementation, the substrate 303 comprises a lead frame. On a wafer scale, the lead frame can comprise one of many such lead frames arranged in a lead frame array. Other suitable substrates may also be used.

The simplified illustration of FIG. 3 shows a side sectional view of portions of the multi-level converter package 300 embodiment. To create a smaller footprint, this embodiment stacks the HS and LS FET's (201, 202) generally one over the other and employs an offset controller 206 mounted with the lead frame 303. Accordingly, it is a stacked arrangement of a different type than illustrated in FIG. 1(a).

To begin, the lead frame 303 comprises a die attach pad (DAP) 311 and a plurality of leads including, but not limited to leads 313 and 316 (some others are described elsewhere in this patent).

A LS FET 202 is mounted on the lead frame 303. Such a FET can be mounted "face down", that is the face surface gate contact 202G and source contact 202S are facing toward the lead frame 303. In particular, the source 202S is electrically contacted with the DAP 311. Also, the gate 202G is electrically contacted with a gate lead 313. Thus, in one embodiment, the lead 313 is configured such that when the LS FET 202 is mounted on the lead frame 303, the lead 313 extends under the LS FET 202 to enable electrical connection between lead 313 and LS FET gate 202G.

To continue, the DAP 311 and gate lead contact 313 typically use solder paste in areas area 313s and 311s to attach the LS FET 202 to the lead frame 303. As before, these connections can be made using solder paste (as shown here) or BGA type connections. A reflow process can be used to affix and electrically connect the LS FET 202 with the lead frame 303.

Also, a clip 309 is mounted with the package 300. Typically, the clip 309 is electrically connected with the drain 202D of the LS FET 202. The clip 309 is also electrically connected with a lead 318 of the lead frame 303. The lead 318 comprises a switch node pin 318 for the package 300. Also the clip 309 is connected with a source 201S of the HS FET 201. It should be pointed out that the nature of this connecting is explained in fuller detail elsewhere in the patent. To continue the combination of electrical connections between the switch node 318, the clip 309, the LS FET drain 202D, and the HS FET source 201S defines a switch connection for the package 300.

On the other side of the clip 309 is arranged an interposer element 321. A typical interposer element 321 has a non-conductive core with electrical connections formed therein. The core can be formed of dielectric materials and insulating materials. The interposer element 321 includes a conductive channel 322 and a gate tab 323. The channel 322 is a conductive channel that passes through the interposer 321 to create a conduction path. The gate conductive tab 323 is formed to interface with a HS FET gate contact 201G. The tab 323 typically does not extend all the way through the interposer 321. This generally prevents shorting against the clip 309 when mounted. Generally, the channel 322 and gate tab 323 comprise conductive materials (like silver, aluminum, gold, as well as many others).

In operation the interposer 321 is generally mated with the HS FET 201 to form a subassembly that can be mounted onto the clip 309 as a unit. In this case, the HS FET 201 is mounted to the interposer 321 in a "face down" orientation. That is to say that the facing surface (that includes source 201S and gate 201G contacts) is arranged so that it faces the interposer element 321. Typically, a solder paste is applied between the HS gate 201G and the tab 323 and also between the HS source 201S and the channel 322 and the whole is reflowed to form the subassembly. However, there are implementations where the interposer 321 is coupled with the clip 309 first, and then the HS FET 201 is attached later.

To continue, the channel 322 of the interposer 321 is intended to facilitate conductive connection between the source 201S and the clip 309 which in turn is coupled with the LS drain 202D forming the switch connection.

Additionally, the gate tab 323 is configured to enable reorientation of a HS gate contact 201 G so that it presents an improved wire bonding surface (such as 324). Accordingly, the gate tab 323 is arranged to electrically couple with the HS gate connection 201G. This arrangement transforms a relatively poor bonding surface 201G into a good wire bonding surface 324 on a top surface of tab 323. Thus, the gate tab 323 is sized and shaped so it will extend beyond the outer periphery of the HS FET 201. In general, the exposed portion 324 of the gate tab 323 only need be big enough to provide a sufficient wire bonding surface. As already indicated, the conductive tab 323 typically does not extend all the way through the interposer. Accordingly, the gate and source of the HS-FET are arranged on the same side of the die Accordingly, one surface of the interposer element 321 is mounted on the clip 309 while the other has the HS FET 201 mounted thereto.

Thus, in the package 300, the conductive channel 322 of the interposer element 321 is electrically connected with the HS FET source 201S and with the clip 309. And the tab 323 is electrically connected with the HS FET gate 201G.

Solder paste can be used to facilitate the connections between interposer 321 and the clip 309. Once attached to the clip, a reflow process can again be performed.

Also, a controller 206 is coupled with the lead frame 303 rather than stacked above the FET's, as in the previous embodiment. The controller 206 can be attached to the lead frame using an epoxy which can be can include conductive and non-conductive adhesives as well as others. The controller 206 is then wire bonded 307b to a lead 313 to establish electrical connect with the LS FET gate contact 202G. And the controller 206 is also wire bonded 307a to a gate tab 323 of an interposer element 321 to couple with the gate 202G of the LS FET 202.

Advantageous aspects of this configuration are that it reduces foot print and that by using the interposer element 321 certain difficulties in the prior art are eliminated while retaining many of its best features.

It is pointed out that electrical connections like Vin and other power connections can be appropriately routed and connected with the FET's and controller. This structure is then encapsulated. Typically using an epoxy or other encapsulating material. Commonly such converter packages are assembled on a wafer scale. Accordingly, the individual packages can be formed by singulating such wafers into individual power converters.

Figure 4A:
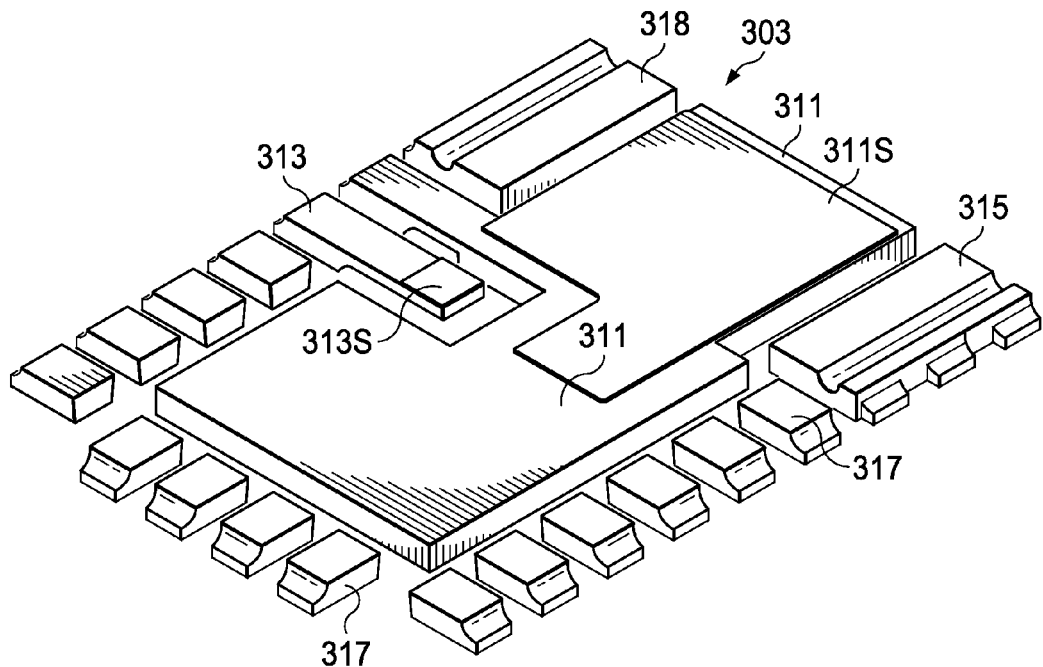
FIGS. 4(a)-4(j) are a set of drawings that illustrate a process embodiment that enables construction of a stacked FET power converter including an interposer element in accordance with the principles of embodiment of the present invention.
Figure 4B:
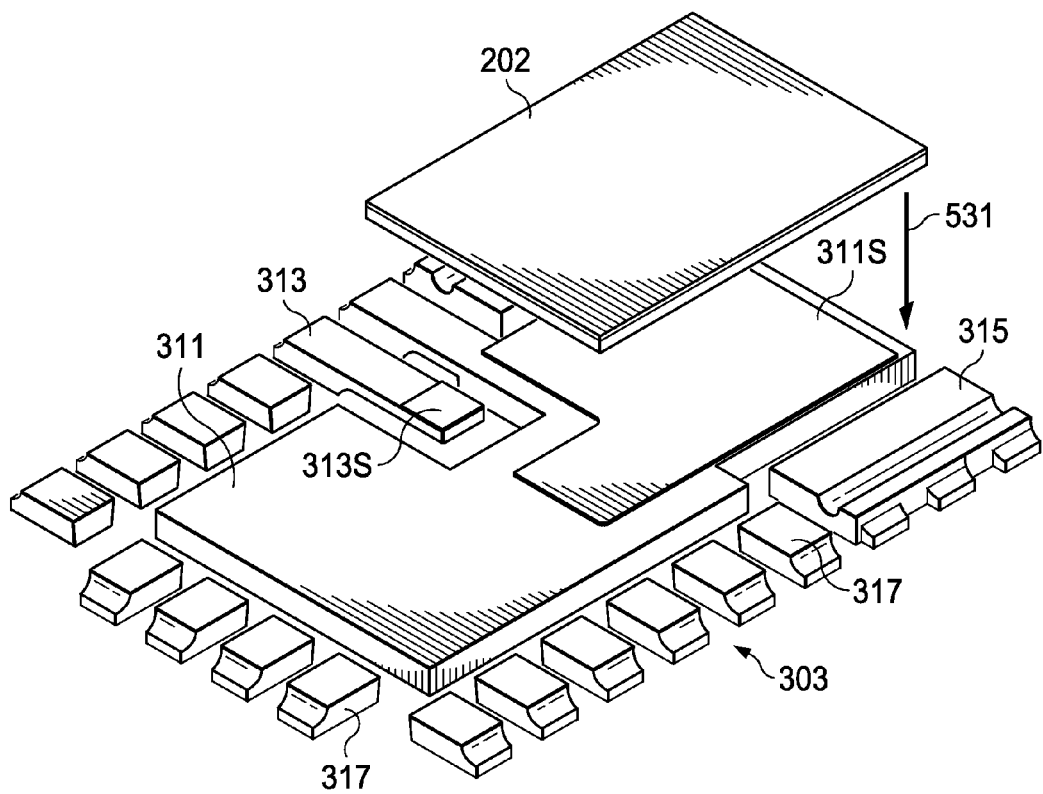
Figure 4C:
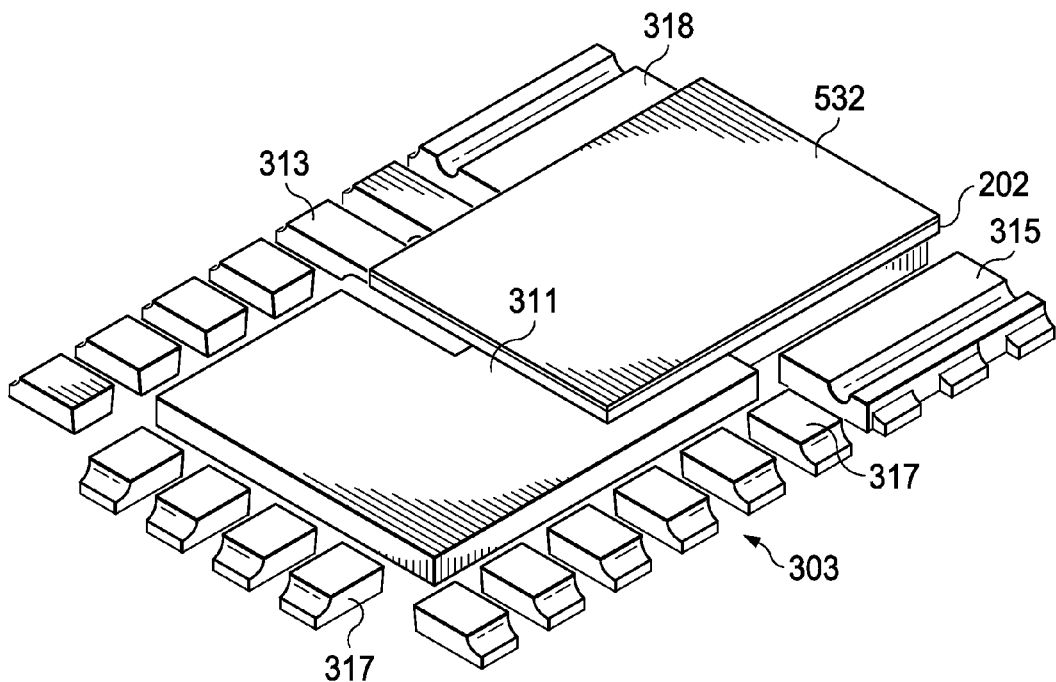
Figure 4D:
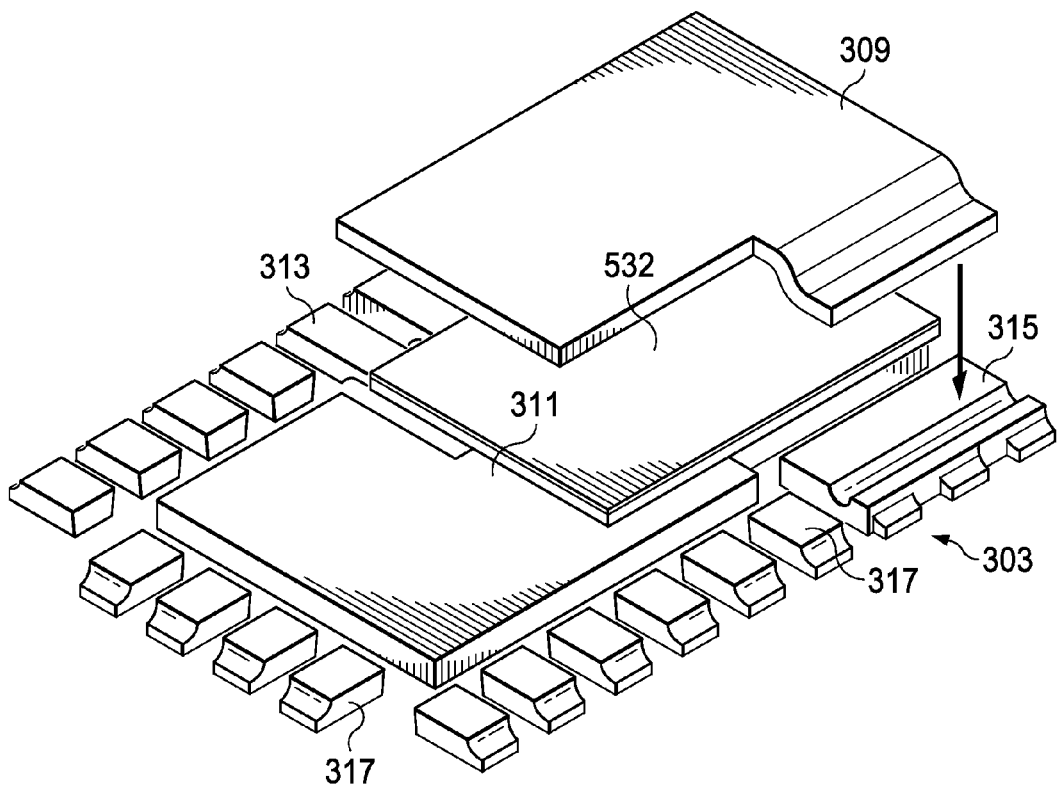
Figure 4E:
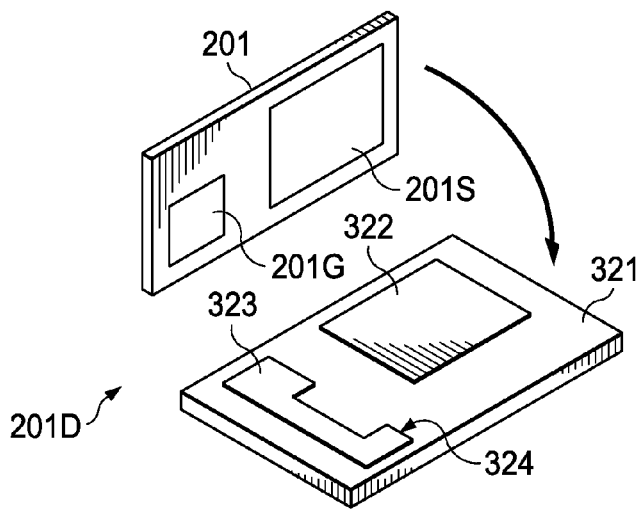
Figure 4F:
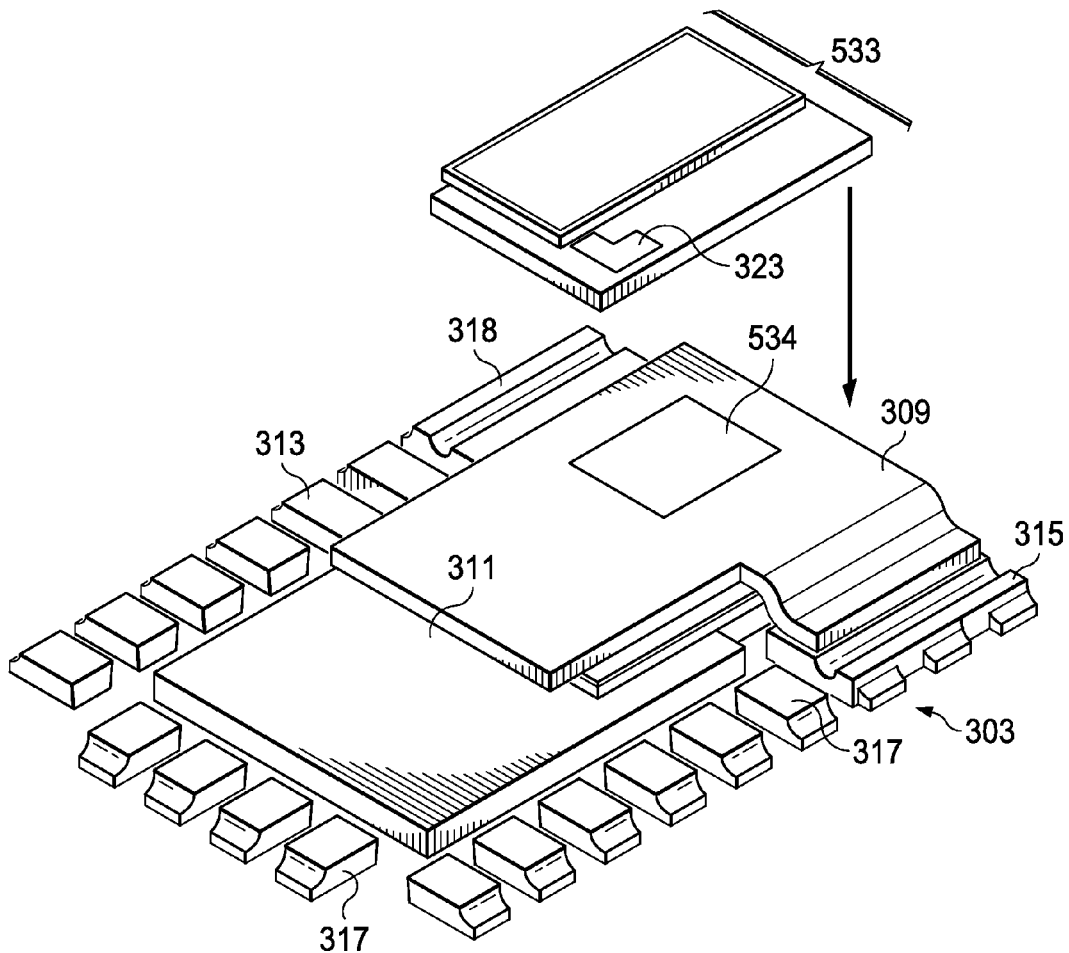
Figure 4G:
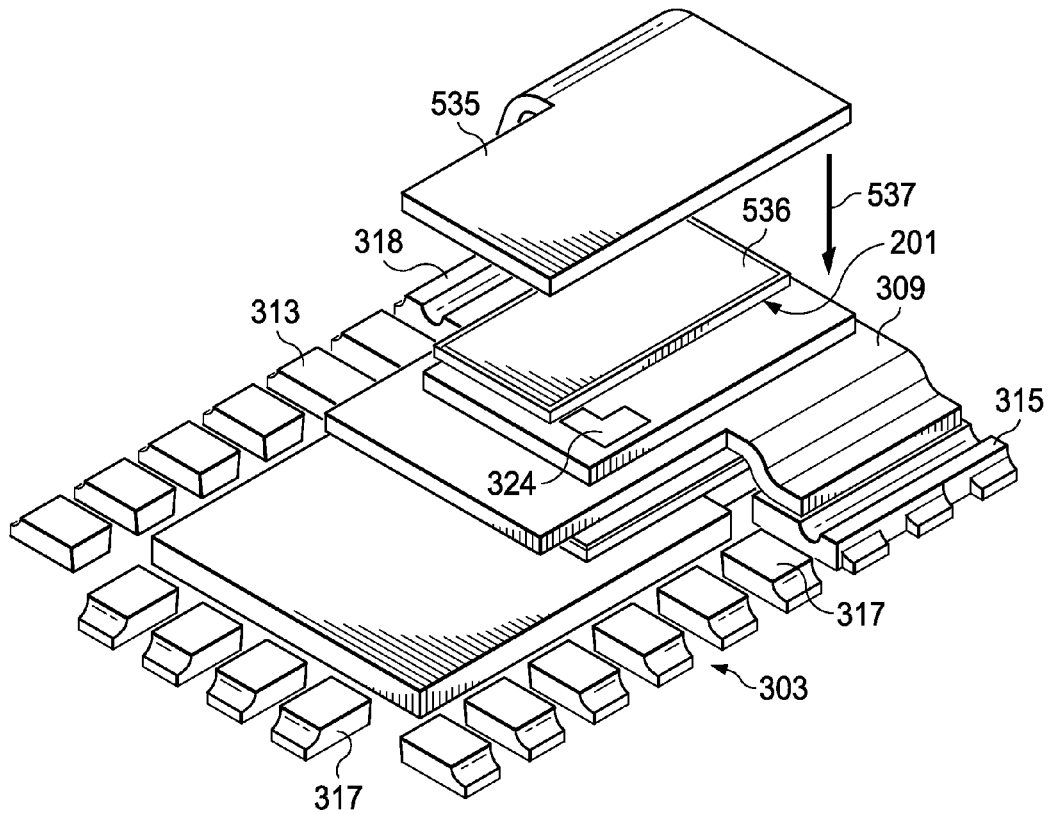
Figure 5:
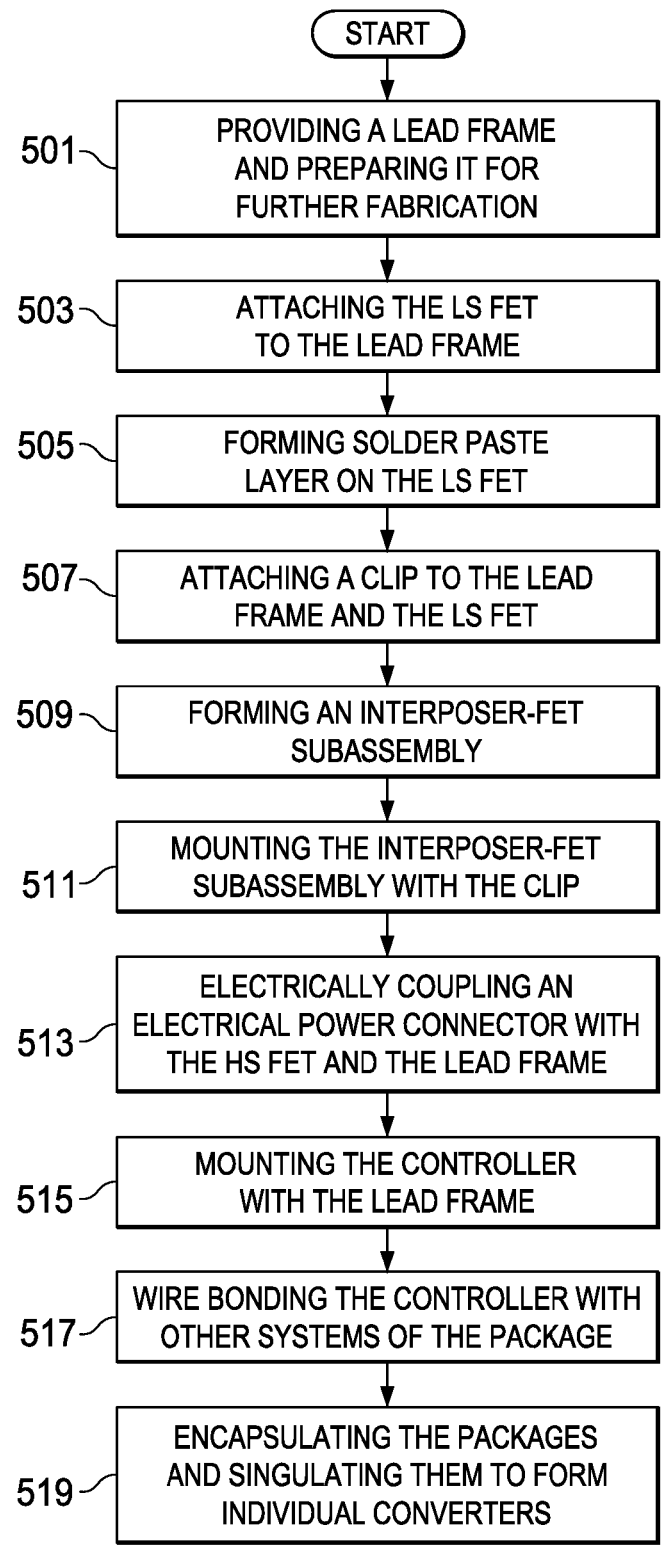
FIG. 5 is a flow diagram that illustrates a process embodiment that enabling construction of a stacked FET power converter including an interposer element in accordance with the principles of embodiment of the present invention.

FIGS. 4(a)-4G) and FIG. 5 provide a series of fabrication operations used in an example process for fabricating power convertors such as discussed with respect to FIG. 3. A process can begin by providing a lead frame substrate 303 and preparing it for further fabrication (Step 501). Commonly this will be a wafer scale array of such lead frames. Such an array can comprise wafer scale plurality of lead frames arranged for fabrication. Additionally, a pre-molded array of lead frames can be used. For example, a lead frame 303 can be treated with encapsulant (or other material) to lend structural rigidity, if desired. The simplified illustration of FIG. 4(a) illustrates a lead frame embodiment 303. Such a lead frame 303 can be configured in a number of different formats. In the depicted embodiment a single DAP 311 can be used along with a number of leads (e.g., 313, 315, 318 and a general arrangement of various other leads 317). Additionally, the lead frame 303 can then be treated with a solder paste to form suitable bonding sites 311s, 313s for electrical connections between contacts and components to be mounted the lead frame 303. For example, a solder pad 311s is arranged to connect with a source 202G of the LS FET. A gate solder pad 313s is arranged to connect a LS FET gate 202G with lead 313. Formation of such solder pads 313s, 311s can be achieved using a variety of methods known in the art.

FIG. 4(b) illustrates an example of the positioning, aligning, and moving 531 of the LS FET 202 into attachment with the solder pads 311s, 313s. The LS FET 202 is then positioned 531 and attached to the solder paste sites (313s, 311s) (Step 503). This attachment is typically facilitated with a reflow process. Additionally, alternate embodiments employ a BOA attachment process rather than the solder paste method.

As shown in the simplified diagram of FIG. 4(c), the bottom surface (that is to say, the upward facing drain contact) of the LS FET 202 is treated with solder paste 532 to present a suitable bonding surface (Step 505). Alternatively, a portion of a subsequently mounted clip 309 can alternatively be treated with a solder paste and then subsequently mounted with the HS FET 202.

As shown in the simplified diagram of FIG. 4(d), the clip 309 is mounted in contact with the layer of solder paste 532 (i.e., drain 202D of the LS FET) (Step 507). Additionally, the clip 309 is electrically coupled with a switch node 315 of lead frame 303. This can also be subject to reflow.

As shown in FIG. 4(e) a method of forming an interposer-FET subassembly 533 is shown (See, also FIG. 4(f) below). Such a sub-assembly is formed by coupling the HS FET 201 with the interposer element 321 (Step 509). The interposer element 321 having a conductive channel 322 and a gate connection tab 323. As indicated above, the conductive channel 322 is configured to enable a current path through the interposer element 321. Typically this path describe current flows between the HS FET source 201S and the clip 309. Also, the gate connection tab 323 is configured such that it provides good electrical connection with a HS FET gate 201 G and so that extends beyond an outer periphery of the HS FET 201 to present a good accessible bonding surface 324. In this view the conductive channel 322 and gate connection tab 323 are shown. As are the gate 201G and the source 201S contacts of the HS FET 201. In this implementation the HS FET 201 is mounted on the interposer element 321 to form the interposer-FET subassembly 533 (See, e.g., FIG. 4(f)).

As shown in FIG. 4(f) the interposer-FET subassembly 533 is then mounted with the clip 309 (Step 511). In one example approach, a solder paste layer 534 is formed on the clip 309 and the interposer-FET subassembly 533 is mounted with the clip 309. The mounting enabling the electrical communication between the conductive channel 322 and the HS FET source 201S and between the clip 309, for example, using the layer 534. Additionally, and importantly the gate tab 323 is exposed for wire bonding. Such is reflowed to facilitate the connection between subassembly 533 and clip 309.

It should be pointed out that in other approaches for mounting the interposer element 321 can include mounting the interposer separately with the clip 309 and then adding the HS FET 201.

Figure 4H:
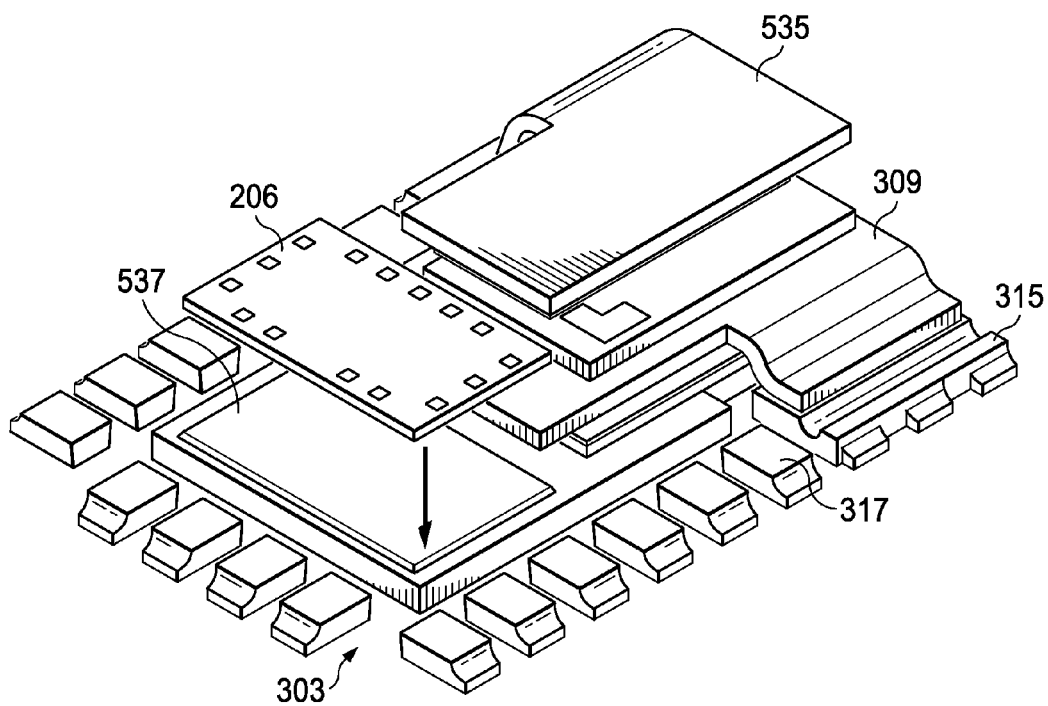

As shown in FIG. 4(g), an electrical power connector 535 can be mounted with the package to electrically couple the power connector 535 with the HS FET 201 (Step 513). The power connector 535 is mounted so as to not obscure the bonding surface 324 of the interposer gate tab 323. It should be pointed out that this connection between the HS FET 201 and the connector 535 can be facilitated using a layer of solder paste 536 arranged on a drain contact 201D of the HS FET 201. Also, the power connector 535 can be connected with one of the leads 318 of the lead frame 303 to enable connection with an external power source. Accordingly, the connection of a lead 318 with the connector 535 can provide power (such as Vin) to the HS FET 201. Accordingly, by moving 537 the connector 535 into position establishes an electrical connection between an external power source, the lead 318, and the HS FET 201, for example, as indicated in FIG. 4(h). The structure can then be reflowed. As mentioned above, instead of a solder paste a BOA type connection can be employed.

If desired all of the preceding reflow processes can be formed at this stage, before the addition of the controller. Moreover, the controller can be solderable. Thus, enabling the controller can be attached at the same time as the LS FET.

FIG. 4(h) illustrates a process where the controller 206 is attached to the lead frame 303 (Step 515). Commonly, the controller 206 is non-conductively mounted on the lead frame 303. For example, the controller 206 can simply be adhered to the lead frame 303 using an adhesive 537.

Figure 4I:
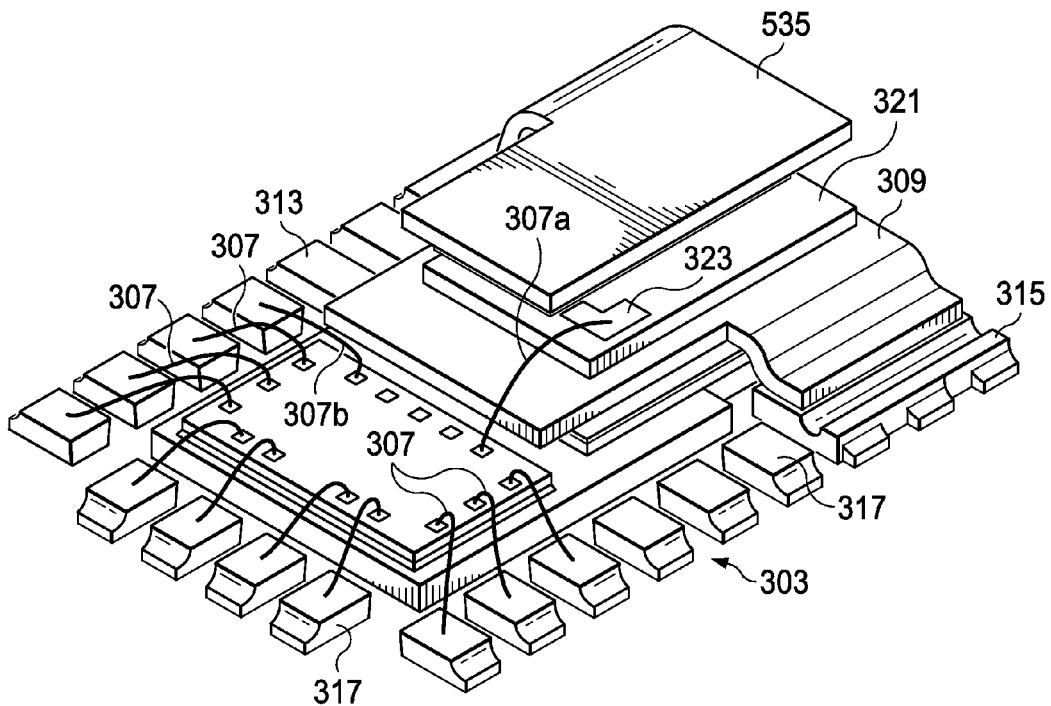

FIG. 4(i) illustrates a process where the connector 206 is wire bonded to various package systems and contacts (Step 517). Once mounted, the controller 206 is attached to the systems of the package using various wire bonds 307. For example, the controller is wire bonded 307b with LS FET gate 202G (in this case using contact lead 313). Also, a wire bond 307a connects the controller 206 with HS FET gate 2010 (i.e., through the gate tab 323 of the interposer 321). And also to various other leads of the lead frame 203 are connected with the controller 206 using other wire bonds 307. Such can include power and ground contacts as well as system inputs to the controller 206.

Figure 4J:
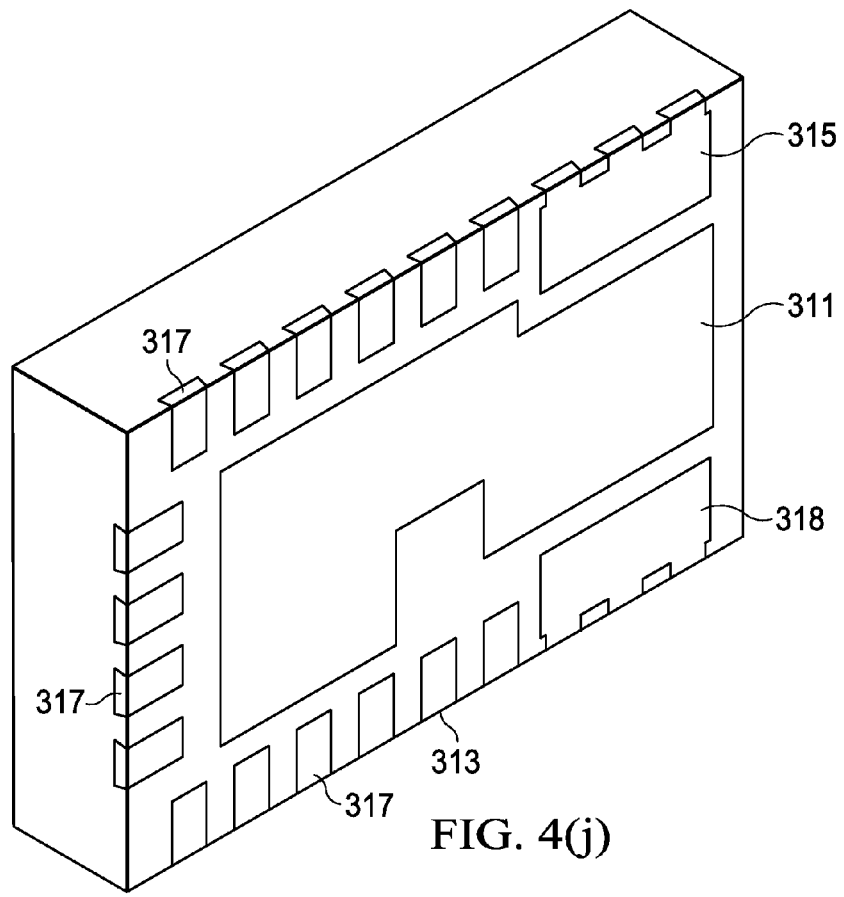

The completed device package is then encapsulated using an appropriate encapsulant (Step 519). Once the encapsulant is cured, an array of formed and encapsulated converter packages can be singulated into separate device packages (Step 521). An embodiment of an encapsulated and singulated package 400 is depicted in FIG. 4(j). In this view the bottom of the package is revealed. The bottom surface reveals the exposed bottom of the DAP 311. Also shown are a number of leads 317 as well as leads 315 and 318. A portion of the lead 313 associated with the LS FET gate 202G is also exposed.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of forming a power converter package, the method comprising,
   electrically coupling a LS FET to a die attach pad of a lead frame;
   non-conductively coupling a controller to the lead frame;
   electrically coupling a first side of a first clip to a drain of the LS FET and to a switch node of the lead frame;
   arranging an interposer element on a second side of the first clip, the interposer element having a gate tab and a conductive channel that passes through the interposer element that is electrically coupled with the drain of the LS FET;
   arranging a HS FET on the interposer such that a source of the HS FET is electrically coupled with the drain of the LS FET through the channel such that the HS FET source, the LS FET drain, and the switch node are electrically coupled via the first clip to form a switch connection;
   wherein said arranging of the HS FET on the interposer further includes arranging the HS FET such that HS FET gate is electrically coupled with the gate tab such that the gate tab extends beyond an outer periphery of the HS FET to present a gate bonding surface;
   electrically coupling a first side of a second clip to a drain of the HS FET and to one of the leads of the of the lead frame to enable connection with an external power source;
   electrically connecting gates of the HS FET and LS FET with the controller using at least wire bonding to the controller;
   encapsulating the power converter package; and singulating the encapsulated package to form a completed power converter package.

2. The method of claim 1 wherein the second clip is electrically coupled with a Vin node of the lead frame and is arranged to provide power to converter package.

3. The method of claim 1 wherein said coupling of the LS FET and the controller to the lead frame is conducted prior to the attachment of the first clip.

4. The method of claim 1 wherein said lead frame comprises a preformed lead frame.

5. The method of claim 1 wherein arranging the HS FET on the interposer element comprises attaching the HS FET to the interposer element to form an interposer sub-assembly which is mounted with the first clip as a unit.

6. The method of claim 5 wherein,
   the LS FET, the lead frame, and the first clip are assembled to form a lead frame sub-assembly;
   the lead frame sub-assembly is coupled with the interposer sub-assembly.

7. The method of claim 1 wherein a second clip is mounted and arranged above the HS FET and electrically coupled with a Vin lead of the lead frame and is electrically coupled with at least the HS FET.

* * * * *